United States Patent [19]
Smith

[11] Patent Number: 5,497,110
[45] Date of Patent: Mar. 5, 1996

[54] FREQUENCY MONITOR AND ERROR DETECTOR CIRCUIT

[75] Inventor: Gerald L. Smith, Torrance, Calif.

[73] Assignee: MAGL Power Inc., Torrance, Calif.

[21] Appl. No.: 420,493

[22] Filed: Apr. 12, 1995

[51] Int. Cl.⁶ .................................................. G01R 23/02
[52] U.S. Cl. .................... 327/42; 327/47; 327/7; 331/DIG. 2
[58] Field of Search ................................. 327/3, 7, 8, 12, 327/40, 41, 42, 43, 48, 49, 47, 113, 243, 155, 146, 154; 331/25, 27, DIG. 2

[56] References Cited

U.S. PATENT DOCUMENTS

| | | | |
|---|---|---|---|
| 4,451,794 | 5/1984 | Yamada | 327/8 |
| 4,940,952 | 6/1990 | Kegasa | 327/7 |
| 5,008,635 | 4/1991 | Hanke et al. | 331/DIG. 2 |
| 5,315,186 | 5/1994 | Baker | 327/43 |

Primary Examiner—Timothy P. Callahan
Assistant Examiner—Jung Ho Kim
Attorney, Agent, or Firm—Monty Koslover Assoc.

[57] ABSTRACT

A frequency monitor and error detector circuit that processes an input ac signal to be monitored, comparing the input ac signal with an internally generated reference center frequency, and outputting a "Go/No-Go" signal indicating whether the monitored ac signal frequency is within a pre-selected tolerance band or is out of tolerance. The reference frequency is provided by a highly accurate crystal oscillator. An adjustable delay circuit is provided, capable of being adjusted to produce a frequency tolerance band of from +/−0.05% to 0.1% of the center frequency. The device has three output signals which may be logic high or logic low, and are used for activating illuminated indicators or as frequency signal inputs to other equipment. The device is small in size, accurate and reliable over a wide range of frequencies.

2 Claims, 1 Drawing Sheet

FREQUENCY MONITOR AND ERROR DETECTOR CIRCUIT

BACKGROUND AND SUMMARY OF THE INVENTION

This invention relates to circuits used to monitor the electrical signals produced by electrical power circuits and equipment, and more particularly to a novel approach to monitoring ac frequency signals over a wide frequency range.

There are presently a number of circuits used to monitor the frequency of a variable output wave and to detect frequency error. However, most of these circuits produce a signal for a frequency meter and occasionally, an error signal. None of the presently known methods produce frequency "go/no-go" signals which can be used to indicate whether the monitored frequency is within a specified band or out of the band. A "go/no-go" output signal would be highly valued by industry which can use it in many ways including the correction of the monitored frequency.

All the currently available methods have several drawbacks, including inability to respond to transient frequency changes, a relatively high component count producing low reliability, and a large board area resulting in high cost. In addition, these methods often have lapses in accuracy when monitoring high frequency waves, particularly when harmonics are present.

Thus there exists a need for a frequency monitor circuit that will produce a "go/no-go" signal output; that will be able to respond to transient frequencies while at the same being highly reliable and low in cost.

The present invention frequency monitor and error detector circuit includes a highly accurate crystal oscillator to generate a reference frequency, a binary counter, and an exclusive OR gate to determine the amount the input monitored frequency varies from the reference. An adjustable delay circuit is provided to check whether the input frequency is within a selected tolerance band. One-shots, a flip-flop and three AND gates are arranged to provide the logic means for output signals indicating whether the monitored frequency is within the tolerance band or out of the band. The circuit thus applies a continuous, simple "go/no-go" test to the monitored frequency while also being capable of responding to transient frequency change. The circuit components are small in size and few in number, making for low cost and high reliability.

Accordingly, it is a principal object of this invention to provide a frequency monitor and error detector circuit that produces a "go/no-go" frequency signal and is accurate at from low to high frequencies over a wide range.

Another object is to provide a frequency monitor and error detector circuit that is able to respond to transient frequencies.

A further object is to provide a frequency monitor circuit that is high in reliability, low in cost and small in size.

Further objects and advantages of the invention will be apparent from studying the following portion of the specification, the claims and the attached drawings.

DESCRIPTION OF THE PREFERRED EMBODIMENT

Figure 1:
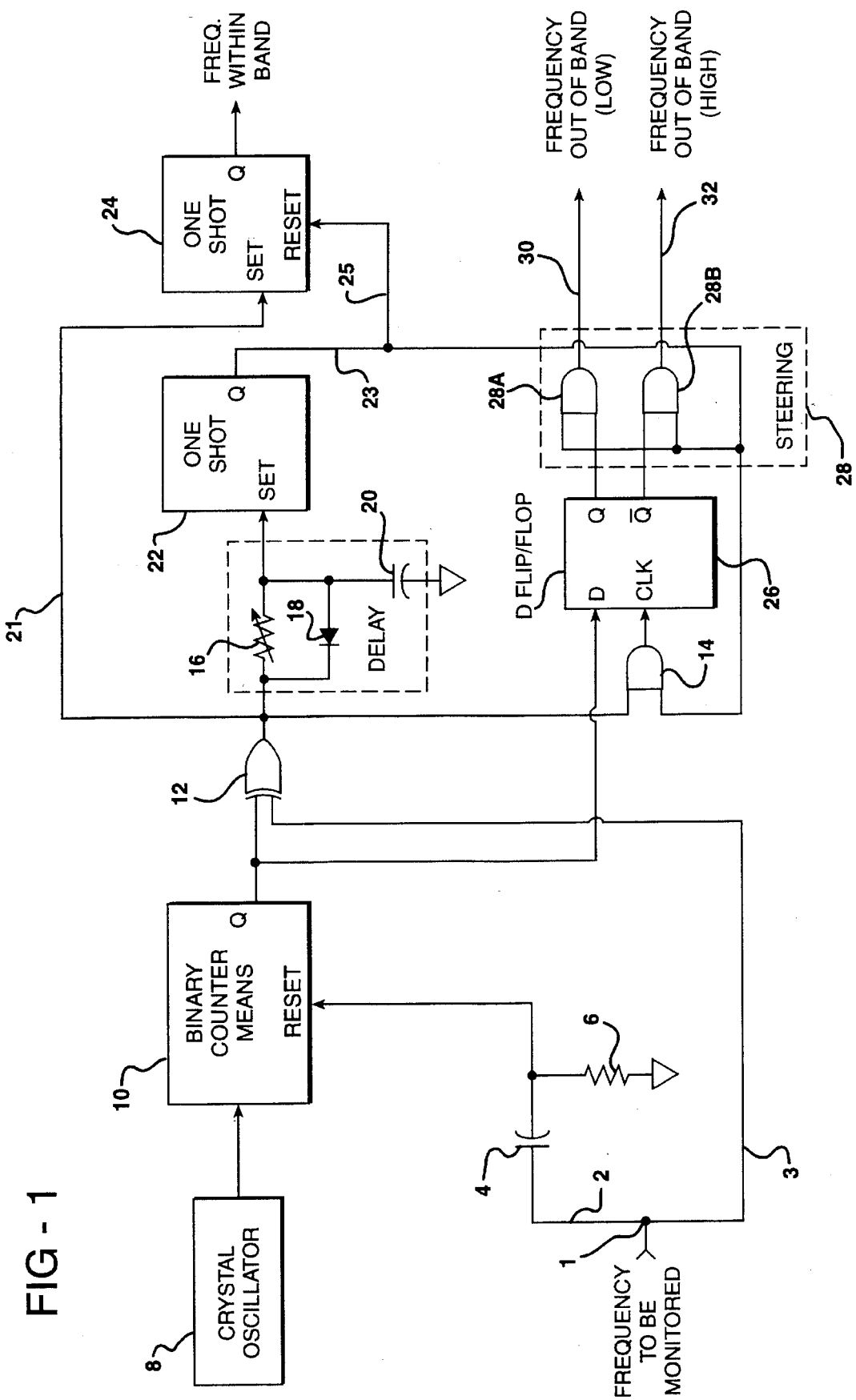
FIG. 1 is a simplified block diagram and schematic of a frequency monitor and error detector in accordance with the present invention.

Referring particularly to the drawings, there is shown in FIG. 1 a block diagram and simplified schematic circuit of the frequency monitor and error detector according to the present invention.

The circuit function is to compare an input wave frequency with a selected reference and to output signals indicating whether the input wave frequency is within a tolerance band of the reference or is out of the frequency tolerance band.

The reference frequency is generated by a pre-selected, highly accurate crystal oscillator having an output, usually expressed as a multiple of the desired center frequency. This center frequency may be pre-selected to be any frequency in the range of 50 hertz (Hz) to 20 megahertz (MHz), while the tolerance band may be manually adjusted to be from +/− 0.05% to +/−0.1%. Thus, for example, the reference frequency may be selected as 400 Hz. and the tolerance band may adjusted to be +/−0.1% of the reference, or +/−0.4 Hz. The input wave frequency would then be monitored for being within (or outside) the limits of 399.6 Hz to 400.4 Hz.

Operation of the frequency monitor and error detector is as follows: A crystal oscillator 8 is selected for the desired reference frequency and its output is connected to the input of a binary counter means 10 which produces an output signal at its Q terminal. The wave frequency signal to be monitored is entered at an input terminal 1 and is connected 2 to a differentiating circuit consisting of a first capacitor 4 and a resistor 6. The differentiated output signal marks the positive going, leading edge voltage signal of the input wave and is connected to the reset terminal of the binary counter 10, which then is initially reset.

The binary counter means 10 output signal is connected to an input terminal of an exclusive OR gate 12 and also to the "D" terminal input of a D flip/flop 26. The input frequency signal 1 to be monitored is also connected 3 to an input terminal of the exclusive OR gate 12, so that the gate 12 compares the output signal of the binary counter 10 with respect to the frequency being monitored. Since the binary counter 10 output signal will be synchronized with the input frequency to be monitored, the exclusive OR gate 12 output signal will be held steady.

The exclusive OR gate 12 output signal will be a positive pulse whose width is proportional to the frequency error of monitored input frequency. This positive pulse is connected to a frequency band delay, to an input of a first AND gate 14 and to the SET terminal of a first One-Shot 24. The frequency band delay consists of an adjustable resistor (potentiometer) 16 in parallel with a diode 18 and a capacitor 20 which is connected to logic ground. The adjustable resistor 16 may be set to produce a time delay which is equivalent to +/−0.05% to 0.1% of the center frequency. This defines the frequency tolerance band.

If the exclusive OR gate 12 error signal is found to be out of the tolerance band, then the capacitor 20 will charge up to the SET threshold of a second One-Shot 22 to which the capacitor is connected, causing the second One-Shot "Q" output to go high. This high "Q" output is connected 25 to the RESET of the first One-Shot 24 and will reset it, disabling a "Frequency Within Band" signal at its "Q" output.

On the other hand, if the exclusive OR gate 12 error signal is found by the frequency band delay to be within the tolerance band, then the second One-Shot 22 "Q" output will be low and the exclusive OR gate 12 output signal will set the first One-Shot 24, producing a high "Frequency Within Band" signal at its "Q" output for indication.

The "Q" output signal of the second One-Shot 22 is connected 23 to the input of a first AND gate 14 and to the inputs of two steering 28 AND gates. When the second One-Shot 22 "Q" output signal is low, the AND gates are disabled.

If the second One-Shot 22 output signal goes high, which is the case when the monitored frequency is out of tolerance, the AND gates will be enabled and the exclusive OR gate 12 output will now propagate through the first AND gate 14 and into the CLK of a D Flip/Flop 26. The binary counter 10 output signal which is connected to the "D" terminal input of the D Flip/Flop 26, will now be compared with the positive going edge of the CLK and a high signal will be switched by the flip/flop 26 to either its Q or Q-bar output. This corresponds to a high Q output for a monitored frequency below the lower band limit, or a high Q-bar output for a frequency found to be above the upper band limit.

The Q and Q-bar terminal outputs of the flip/flop 26 are connected to the steering AND gates 28, with Q being connected to the second AND gate 28A and Q-bar being connected to the third AND gate 28B. Thus when the flip/flop 26Q goes high, the second AND gate 28A will be activated and will output a signal 30 which will be used to indicate a frequency out of (tolerance) band, low side.

Similarly, if the flip/flop 26 Q-bar goes high instead, the third AND gate 28B will be activated and will output a signal 32 used to indicate a frequency out of (tolerance) band, high side. These gate output signals together with the first One-Shot 24 "Frequency Within Band" signal constitute precise "Go/No-Go" signals for use in monitoring the frequency of any ac circuit or generator and indicating any frequency out of band error. The output signals may be used to light indicators or as inputs to circuit means for correcting the monitored frequency.

All the solid state components used are fast switching, small in size and consume little power. Similarly, all resistors and capacitors used are small in size and consume little power. As a result, the board on which the circuit is mounted requires minimal cooling. In addition, the circuit reliability is high due to the use of few components and their low operating stress in accordance with recommended high reliability practice.

From the above description, it is clear that the preferred embodiment circuit achieves the objects of the present invention. Alternative embodiments and various modifications may be apparent to those skilled in the art. These alternatives and modifications are considered to be within the spirit and scope of the present invention.

Having described the invention, what is claimed is:

1. A frequency monitor and error detector circuit which detects any input ac signal deviation from a certain fixed reference frequency, said circuit comprising in combination:

(a) a device input terminal for connecting an input ac wave which is to be monitored;

(b) a crystal oscillator, said crystal oscillator producing a signal which is a multiple of said reference frequency;

(c) a binary counter means, said binary counter means having its input terminal connected to an output of said crystal oscillator;

(d) a differentiating circuit comprising a first capacitor and a resistor, said first capacitor being connected to said device input terminal, said differentiating circuit producing a signal pulse marking a positive-going leading edge of said input ac wave at its capacitor to resistor connection, said signal pulse being directly connected to a RESET terminal of said binary counter means;

(e) an exclusive OR gate having an input connected to a Q output terminal of said binary counter means, and a second input connected to said device input terminal; said exclusive OR gate producing an output positive pulse whose width is proportional to a frequency error of said input ac wave being monitored;

(f) a delay circuit means connected to the output positive pulse of said exclusive OR gate; said delay circuit means setting a selected frequency tolerance band and producing a high output signal when an out-of-tolerance condition is found;

(g) a first one-shot; said first one-shot having its SET terminal connected to the output of said exclusive OR gate; said first one-shot, when set by the output of said exclusive OR gate, producing a high signal at its Q output, said high signal of said first one-shot indicating a Frequency Within Band condition; and (h) an error detector cult comprising a second one-shot, a first AND gate, a D flip/flop, a second AND gate and a third AND gate, said second and third AND gates being connected to form a steering circuit; said second one-shot having its SET terminal connected to the output of said delay circuit means and producing a high signal at its Q output when activated, said Q output of said second one-shot being connected to a RESET terminal of said first one-shot and disabling said first one-shot, and also connected for a purpose of enabling, to input terminals of said steering circuit and said first AND gate; said first AND gate having an input terminal connected to an output of said exclusive OR gate, said first AND gate output being connected to a CLK input terminal of said D flip/flop; said D flip/flop having its D input terminal connected to the output of said binary counter means; said D flip/flop comparing its D input signal with a positive-going edge of its input CLK signal and switching a high signal to either its Q output or to its Q-bar output, said Q output of said D flip/flop being connected to an input terminal of said second AND gate in said steering circuit, said Q-bar output being connected to an input terminal of said third AND gate in said steering circuit; said second AND gate, when activated, having its output go high; said third AND gate, when activated, having its output go high;

said error detector circuit operating by said second one-shot receiving said high output signal of said delay circuit means, thereby causing the Q output of said second one-shot to produce the high signal; said high signal from said second one-shot being input to the RESET terminal of said first one-shot and disabling said first one-shot Q output; said high signal from said second one-shot also enabling said first AND gate and the second and third AND gates in said steering circuit to thereby activate said first AND gate and permit the output signal of said exclusive OR gate to propagate through said first AND gate into the CLK terminal of said D flip/flop; said D flip/flop comparing its D and CLK input signals and switching a high signal to its Q output or its Q-bar output;

said Q output of said D flip/flop, if high, activating said second AND gate and causing its output to go high, indicating a Frequency Out Of Band (Low) condition;

said Q-bar output of said D flip/flop, if high, activating said third AND gate and causing its output to go high, indicating a Frequency Out Of Band (High) condition.

2. The frequency monitor and error detector circuit as defined in claim 1 wherein:

said delay circuit means includes a delay circuit comprising an adjustable resistance, a diode connected in parallel with said adjustable resistance and a second capacitor, said second capacitor being connected to an output terminal of said adjustable resistance and to logic ground; said delay circuit producing a delay time for processing an input signal received from said exclusive OR gate; said second capacitor becoming charged when said delay time is exceeded, and producing a high signal for input to the SET terminal of said second one-shot; said adjustable resistance being capable of manual adjustment, changing said delay time and producing from +/−0.05% of center frequency tolerance band to a +/−0.1% of center frequency tolerance band.

* * * * *